United States Patent
Miyano et al.

(10) Patent No.: US 6,656,854 B2
(45) Date of Patent: Dec. 2, 2003

(54) METHOD OF FORMING A LOW DIELECTRIC CONSTANT FILM WITH TETRAMETHYLCYCLOTETRASILOXANE (TMCTS) AND LPCVD TECHNIQUE

(75) Inventors: Junichi Miyano, Miyazaki (JP); Kiyohiko Toshikawa, Miyazaki (JP); Yoshikazu Motoyama, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/052,243

(22) Filed: Jan. 23, 2002

(65) Prior Publication Data

US 2002/0182854 A1 Dec. 5, 2002

(30) Foreign Application Priority Data

May 31, 2001 (JP) ........................................ 2001-163786

(51) Int. Cl.[7] ........................ H01L 21/31; H01L 21/469
(52) U.S. Cl. .................... 438/778; 438/787; 438/789; 438/790
(58) Field of Search .................... 438/778, 787, 438/789, 790

(56) References Cited

U.S. PATENT DOCUMENTS

| 5,028,566 | A | * | 7/1991 | Lagendijk ................ 438/784 |
| 5,098,865 | A | * | 3/1992 | Machado et al. ......... 438/788 |
| 5,204,141 | A | * | 4/1993 | Roberts et al. ....... 427/255.37 |
| 5,314,724 | A |   | 5/1994 | Tsukune et al. ........... 427/489 |
| 5,583,078 | A | * | 12/1996 | Osenbach .................. 438/763 |
| 5,605,867 | A | * | 2/1997 | Sato et al. ................. 438/790 |
| 5,639,699 | A | * | 6/1997 | Nakamura et al. ......... 427/527 |
| 5,679,589 | A | * | 10/1997 | Lee et al. .................. 438/305 |
| 5,710,079 | A | * | 1/1998 | Sukharev ................... 438/778 |
| 6,287,990 | B1 | * | 9/2001 | Cheung et al. ........... 438/780 |
| 6,303,523 | B2 | * | 10/2001 | Cheung et al. ........... 438/780 |
| 6,348,725 | B2 | * | 2/2002 | Cheung et al. ........... 257/642 |
| 6,461,982 | B2 | * | 10/2002 | DeBoer et al. ........... 438/778 |

FOREIGN PATENT DOCUMENTS

| JP | 2000-21982 | 1/2000 |
| WO | WO 092/12535 | 7/1992 |

OTHER PUBLICATIONS

Product Specification of Schumacher.

* cited by examiner

*Primary Examiner*—George Fourson
*Assistant Examiner*—Fernando Toledo
(74) *Attorney, Agent, or Firm*—Volentine Francos, PLLC

(57) ABSTRACT

In a method for manufacturing a semiconductor device, a semiconductor substrate is provided. On the substrate, conductors spaced apart from one another are formed. Then, an insulating layer is formed on the conductors and the substrate. The insulating layer is formed by a chemical vapor deposition using tetramethylcyclotetrasiloxane as a source gas and oxygen as an adjunction gas. The chemical vapor deposition is performed while the substrate is irradiated by vacuum ultraviolet light. Finally, a part of the insulating layer is removed in a substantial uniform way to form a contact hole through the insulating film.

19 Claims, 3 Drawing Sheets

METHOD OF FORMING A LOW DIELECTRIC CONSTANT FILM WITH TETRAMETHYLCYCLOTETRASILOXANE (TMCTS) AND LPCVD TECHNIQUE

BACKGROUND OF THE INVENTION

The present invention relates to a method for manufacturing a semiconductor device such as a DRAM including a plurality of MOSFET, particularly to a method for forming a contact hole through an inter-layer insulating layer.

A semiconductor element, such as a Metal-Oxide-Semiconductor Field Effect transistor ("MOSFET") formed on a semiconductor substrate, is covered by an inter-layer insulating layer such as a silicon oxide layer. The inter-layer insulating layer has a contact hole perforated in the direction of thickness of the inter-layer insulating layer. The contact hole is filled with conductive material that makes an electric contact of the semiconductor element with a conductive layer over the inter-layer insulating layer.

Conventional methods for forming the above-mentioned contact hole include so-called Self-Aligned Contact ("SAC") method. According to an example of the conventional SAC method, a silicon nitride (SiN) layer is first formed to cover sidewall of the gate of the transistor. Then, an inter-layer insulating layer is formed on the silicon nitride layer. Because of the difference of etching rates, the silicon nitride layer functions as an etch-stopping layer. Therefore by etching the inter-layer insulating layer, a contact hole is formed on a portion of the inter-layer insulating layer under which the silicon nitride layers are not formed.

However, according to the conventional SAC method, it is required to perform process steps for forming the silicon nitride layer and patterning the silicon nitride layer. Therefore, forming a contact hole as a whole includes complicated process steps, and manufacturing cost for a semiconductor device is increased.

SUMMARY OF THE INVENTION

Therefore, the present invention provides a method for manufacturing a semiconductor device by forming a contact hole through simplified process steps.

The present invention may be achieved by using a low pressure chemical vapor deposition ("LPCVD") method for forming an inter-layer insulating layer with tetramethylcyclotetrasiloxane ($[SiH(CH_3)]_4O_4$) as a source gas and oxygen gas as an annexation gas under vacuum ultraviolet light.

Basically, the method for manufacturing a semiconductor device of the present invention includes a process step for forming a contact hole, which perforates through an insulating layer in the direction of thickness of the insulating layer. The insulating layer is formed to cover conductors spaced apart from one another and formed on the surface of the semiconductor substrate. In order to form the insulating layer, tetramethylcyclotetrasiloxane ($[SiH(CH_3)]_4O_4$) as a source gas and an oxygen gas as an adjunction gas are provided into a reaction chamber of a LPCVD apparatus where the semiconductor substrate is placed. Then, the insulating layer is formed under vacuum ultraviolet light illuminating the semiconductor substrate.

By forming the insulating layer according to the method described above, the insulating layer has a surface profile corresponding to a convex and concave profile of the conductors on the semiconductor substrate. Further portions of the insulating layer, corresponding to the surface portions of the semiconductor substrate are formed to be relatively thin. Therefore, by etching the whole insulating layer, the relatively thin portions of the insulating layer is removed. That is, a contact hole is formed through the insulating layer without performing conventional process steps, such as forming a silicon nitride layer and patterning the silicon nitride layer.

The process step for etching the insulating layer may preferably be a step for performing a dry etching almost uniformly on the overall surface of the insulating layer, so that the relatively thin portions can be removed without damaging other portions. Further, as described above, since it is possible to perform a "blanket" dry etching, there is no need to use an etching mask for forming a contact hole.

BRIEF DESCRIPTION OF THE DRAWINGS

A further understanding of the nature and advantage of the present invention will become apparent by reference to the remaining portions of the specification and drawings.

DETAILED DESCRIPTION OF THE PREFERRED EMBODIMENTS

Now, referring to attached drawings, embodiments of the present invention are described in detail.

Figure 1:
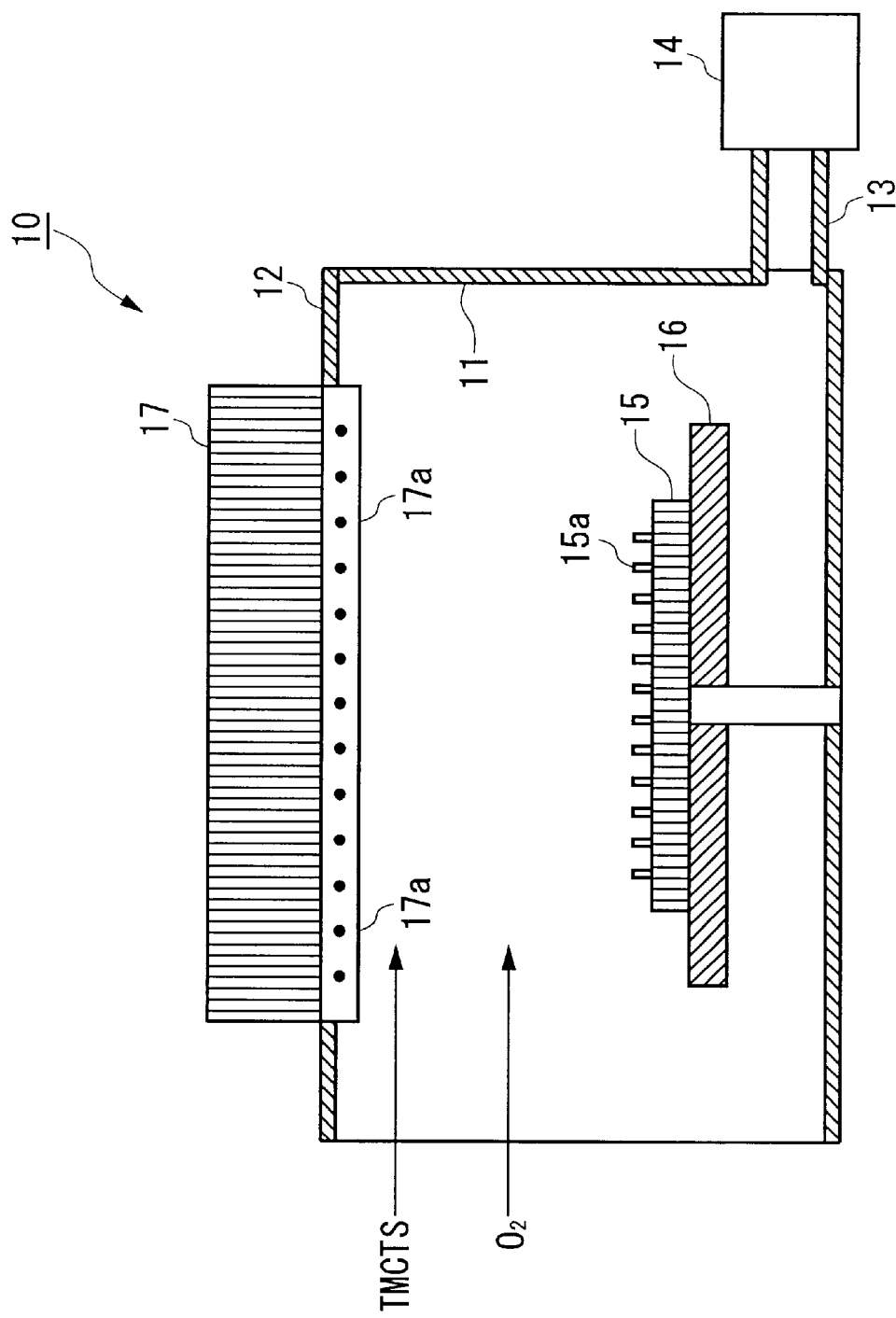
FIG. 1 is a schematic diagram showing a cross sectional view of a CVD apparatus related to a method according to an embodiment of the present invention.

Now, referring to FIG. 1, here is shown an LPCVD apparatus 10 for performing the method for manufacturing a semiconductor device according to the present invention. The LPCVD apparatus 10 is used for forming an insulating layer, for example a silicon nitride layer, on a semiconductor substrate.

As shown in FIG. 1, the LPCVD apparatus 10 includes a box type housing 12, the inner space of which functions as a reaction chamber 11, a negative pressure source 14, such as a vacuum pump, coupled to the housing 12 through a pipe 13 for maintaining the reaction chamber under a low pressure condition, a susceptor 16 for holding and supporting a semiconductor wafer 15 made of, for example, silicon in the reaction chamber 11, and a vacuum ultraviolet light source 17, such as a $Xe_2$ excimer laser source. The vacuum ultraviolet light source 17 may be selected from various kinds of laser sources which can radiate short wavelength lights of 200 nm or less or ultraviolet lights having wavelengths in vacuum ultraviolet light range.

An experimental result according to the present invention, which can show the effect of the present invention, is described, hereinafter.

A plurality of wiring conductors 15a having width of 0.5 um and height of 0.5 um are formed on the surface of the semiconductor wafer 15. Each of the wiring conductors 15a is spaced apart from the adjacent one by, for example, 0.7 um. The semiconductor wafer 15 is supported by the susceptor 16 with the surface, on which the wiring conductors 15a are formed, of the wafer 15 facing up. Temperature of the semiconductor wafer 15 is controlled by controlling temperature of the susceptor 16 and maintained to be the same as the room temperature of the chamber.

The vacuum ultraviolet light source 17 includes a quartz window 17a as a radiation window having a quartz plate of 20 mm in thickness. The light source 17 is supported the housing so that the quartz window 17a is located over the semiconductor wafer 15. The vacuum ultraviolet light is radiated onto the semiconductor wafer 15 through the quartz window 17a.

In the experiment, in order to form an insulating layer which covers the wiring conductors 15a on the semiconductor wafer 15, tetramethylcyclotetrasiloxane ([SiH(CH$_3$)]$_4$O$_4$) ("TMCTS") as a source gas and oxygen gas (O2) as an annexation gas are provided into a reaction chamber 11.

The distance between the semiconductor wafer 15 supported by the susceptor 16 and the quartz window 17a of the vacuum ultraviolet light source 17 is maintained to be about 15 mm, and the illuminance of the vacuum ultraviolet light source is 10 mW/cm$^2$ directly under the quartz window 17a. The semiconductor wafer 15 is irradiated by the vacuum ultraviolet lights having the illuminance 10 mW/cm2. Under these conditions, both of the TMCTS and the oxygen gas are provided into the chamber 11 at a same rate of 50 sccm. The reaction pressure of the chamber is 300 mTorr.

As described in detail below, it is preferable to heat the quartz window 17a to a temperature over the temperature of the vacuum ultraviolet light source 17 in order to prevent the insulating layer from growing on the surface of the quartz window 17a and resulting in degradation of the quartz window 17a.

After about 15 minutes of operating the LPCVD apparatus 15 under the above-described conditions, an insulating layer having thickness of about 1.5 um is formed. Further, it is observed that the insulating layer has a "selective growth" characteristic. In other words, the insulating layer has a surface profile according to the convex and concave profile of the wiring conductors 15a, and portions of the insulating layer between any pair of the wiring conductors 15a are extremely thinner than other portions of the insulating layer, which can be verified by using a Scan Electron Microscope ("SEM").

Figure 2:
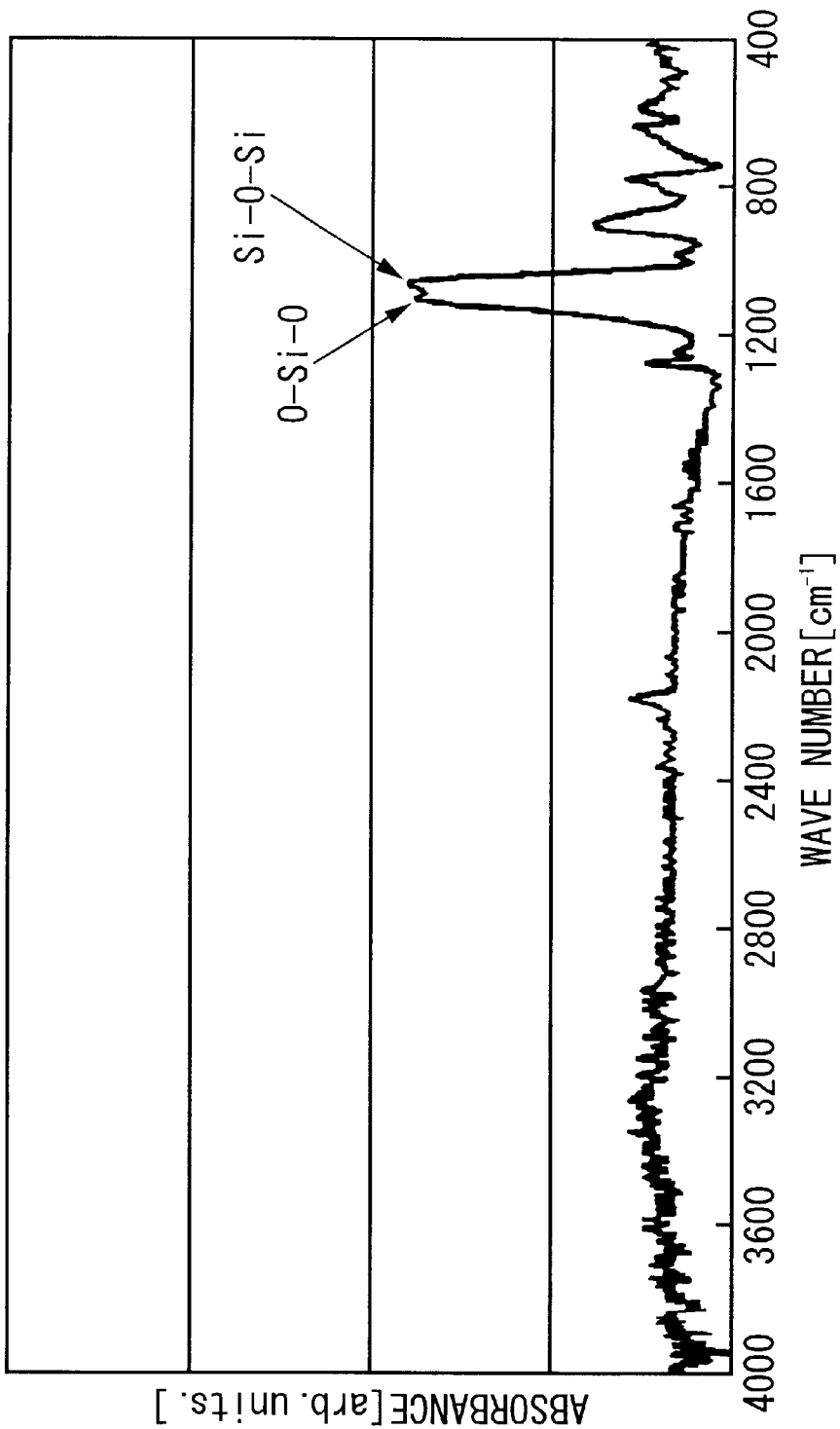
FIG. 2 is a graph showing an FTIR analysis result of an insulating layer according to the present invention.

FIG. 2 shows a spectroscopic analysis result of the insulating layer by using a Fourier transform infrared spectroscopy.

In the graph, the horizontal axis is for wave numbers [cm$^{-1}$], which is reciprocals of wavelengths, of the infrared lights irradiated onto the sample, the insulating layer, and the vertical axis is for absorbance [random unit].

According to the Fourier transform infrared spectroscopy, infrared light of a wavelength corresponding to the characteristics of a sample is absorbed by the sample at a very high absorbance if the infrared light is irradiated on the sample while the wavelength of the infrared light is continuously shifted. Therefore, it is possible to identify the sample material by obtaining the wave number of the infrared light at which the absorbance is the highest.

According to the analysis result shown in FIG. 2, silicon dioxide SiO$_2$ and di-silicon oxide Si$_2$O are shown to be main ingredients of the insulating layer. Both of these two ingredients are electrically nonconductive. Especially, since the di-silicon oxide Si$_2$O is an organic material and has smaller dielectric constant than the silicon dioxide SiO$_2$, the insulating layer including both materials has good characteristics as an inter-layer insulating layer of a semiconductor device.

Therefore, for example, by performing dry etching for removing the silicon dioxide almost uniformly on the overall portion of the insulating layer enough to remove the above described relatively thin portions, it is possible to form a hole perforating to the surface of the semiconductor wafer 15 without damaging the wiring conductors 15a.

As described above, since this hole perforates to the surface of the semiconductor wafer 15 through the insulating layer, it is possible to use this hole as a contact hole. As widely known in the art, the contact hole is filled with conductive material, or a conductive film is formed on the insulating layer in order that an electric contact with the semiconductor wafer 15 can be established.

FIGS. 3(a) to 3(e) are cross sectional views of a MOSFET of a semiconductor device showing process steps for forming contact holes coupled to drain/source of the MOSFET according to an embodiment of the present invention.

Figure 3A:
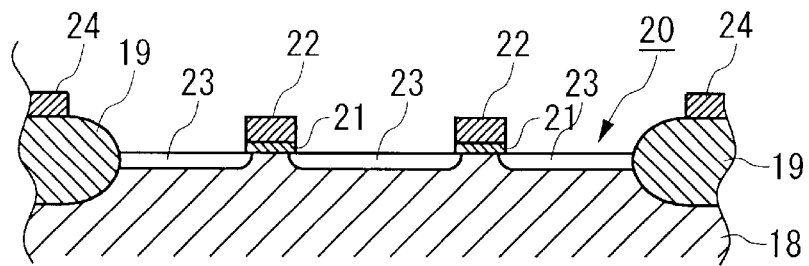
FIGS. 3a to 3e are cross sectional views of a semiconductor device showing process steps for forming contact holes according to an embodiment of the present invention.

As shown in FIG. 3(a), a field oxide layer 19 is formed on a semiconductor substrate 18, such as a silicon semiconductor substrate, according to the well-known LOCOS process. A gate oxide layer 21 made of silicon dioxide is formed on an active layer 20 defined by the field oxide layer 19, according to, for example, a thermal oxidation process. A plurality of gates 22 are formed to be extended in parallel to each other on the gate oxide layer 21 according to a well-known photolithography process.

Each of the gates 22 is, for example, 0.18 um in width. The total thickness of the gate oxide 21 and the gate 22 is, for example, 0.3 um. Each of the gates 22 is formed to be spaced apart from the adjacent one by 0.2–0.7 um on the semiconductor substrate 18.

The gate 22 may be made of metal material, such as tungsten, or metal alloy, such as Al—Si—Cu alloy. The gate 22 may also be made of a conductive polysilicon, well known in the art, including conductive impurities. Both sides of each of the gates 22 on the active area 20 of the semiconductor substrate 18 have impurity areas 23 for sources and/or drains formed by, for example, ion implantation process.

Further, as shown in the drawings, conductor lines 24, which are extensions of the gates 22, are formed on the field oxide layer 19.

Figure 3B:
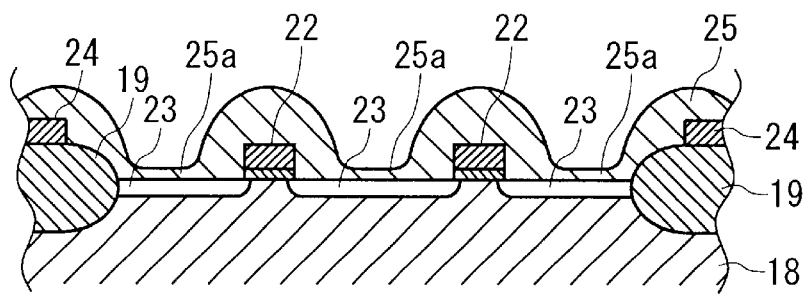

As shown in FIG. 3(b), an insulating layer 25 is formed to cover the gates 22 and the conductor lines 24 on the semiconductor substrate 18, where the gates 22 are formed on the active area 20 and the conductive lines are formed on the field oxide layer 19.

In order to form the insulating layer 25, the semiconductor substrate 18, where the gates 22 and conductor lines 24 are formed as shown in FIG. 3(a), is supported for the surface, on which the gates 22 and conductor lines 24 are formed, to face up by the susceptor 16 of the LPCVD apparatus 10, shown in FIG. 1. The insulating layer 25 is formed under the same conditions as described above.

As shown in FIG. 3(b), the insulating layer 25 is mostly formed on the gates 22 and conductor lines 24, which are made of conductive materials and constitute convex portions on the semiconductor substrate 18, under the conditions as described above. Therefore, the insulating layer 25 has a wave-like surface profile according to the convex and concave profile of the convex portions, the gates 22 and conductor lines 24.

Further, the insulating layer 25 is restrained from forming between the convex portions 22 and 24. Therefore, the insulating layer 25 has relatively thin portions 25a between the convex portions 22 and 24.

After forming the insulating layer 25 under the above-described conditions, a well-known dry etching for silicon dioxide is performed on the overall portions of the desired area of the insulating layer 25. The relatively thin portions 25a of the desired area of the insulating layer 25 is completely removed.

In order to perform the dry etching selectively on the desired area of the insulating layer 25, it is possible to use an etching mask. However, since the relatively thin portions 25a of the insulating layer 25 are easier to be removed than the other portions of the insulating layer 25, the etching mask does not need to be aligned as precisely as conventionally done.

Figure 3C:
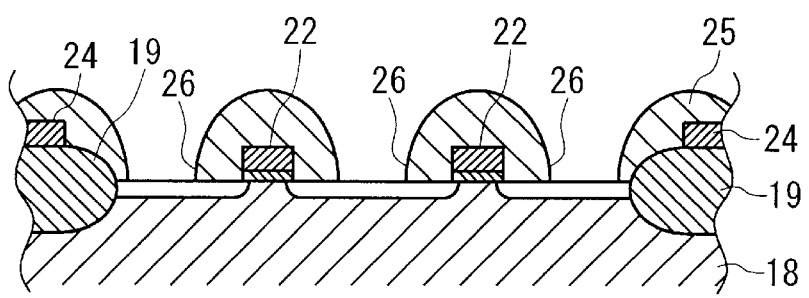

As shown in FIG. 3(c), by performing the etching process, the relatively thin portion 25a of the desired area of the insulating layer 25 is removed, the impurity area 23 of the semiconductor substrate 18 is exposed and a contact hole 26 is formed.

Figure 3D:
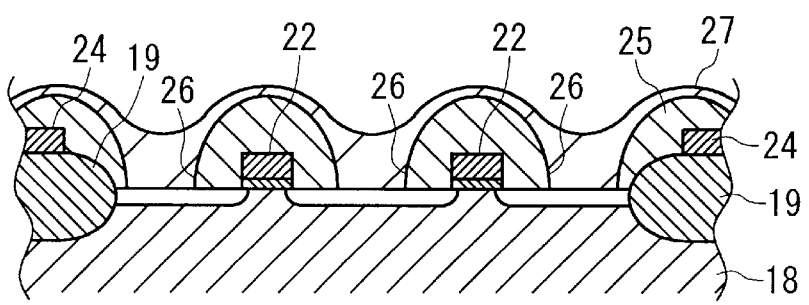

As shown in FIG. 3(d), after forming the contact hole 26, in order to fill in the contact hole 26 and cover the other portions of the insulating layer 25, for example, a conductive polysilicon 27 is formed.

Figure 3E:
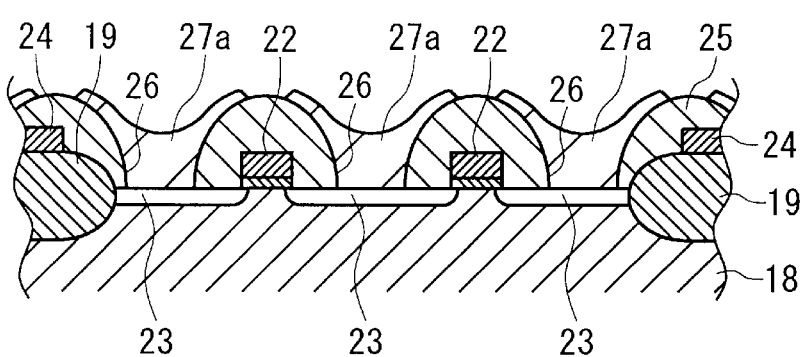

Finally, as shown in FIG. 3(e), unnecessary portions of the polysilicon 27 on the insulating layer is removed by photolithography and etching process. An electric contact with the impurity area 23 through the insulating layer 25 is established by the remaining polysilicon 27a in the contact hole 26 of the insulating layer 25.

Over this contact 27a, additional wiring layers (not shown) and insulating layers (not shown) may be formed.

According to the embodiment of the present invention, it is possible to form an insulating layer 25 having a surface profile corresponding to the convex and concave profile of the gates 22 and the conductor lines 24 on the semiconductor substrate. Further, the insulating layer 25 has a relatively thin portion 25a at a place corresponding to the place between any pair of the gates 22 or the conductor lines 24. By performing etching process on overall portion of the insulating layer 25, it is possible to form a contact hole perforating the insulating layer 25 by etching the thin portion 25a of the insulating layer 25 without performing processes of forming and patterning a nitride layer, which is required for a conventional SAC process.

The etching process is a dry etching process performed almost uniformly on overall portions of the desired area of the insulating layer. By this dry etching process, it is possible to remove only the relatively thin portions 25a without damaging the other portions than the relatively thin portions 25a of the insulating layer 25. Therefore, it is possible to perform a "blanket" dry etching on the insulating layer. Further, since it is not needed to use highly precise masks, it is possible to form a contact hole relatively easily.

Since formation the relatively thin portions 25a of the insulating layer 25 is depend on the distance between adjacent convex portions 22 and/or 24, it is possible to restrain the insulating layer 25 from forming by increasing the distance between adjacent convex portions 22 and/or 24. Therefore, it is preferable to design a circuit layout so that the distance between adjacent convex portions 22 and/or 24 becomes relatively short. In other words, the density of gates 22 and/or conductor lines 24 becomes high on an area of the semiconductor substrate 18 where the contact hole is not needed. Further, distance between adjacent convex portions 22 and/or 24 becomes relatively long. In other words, the density of gates 22 and/or conductor lines 24 becomes low on an area of the semiconductor substrate 18 where the contact hole is needed.

In the above description, it is described to apply the method of the present invention to processes for manufacturing a MOSFET. The present invention, however, can also be applied to processes for forming a contact hole for a memory cell capacitor of a DRAM.

Further, the present invention can also be applied to processes for forming a transistor of the peripheral area of memory cells or other various kinds of semiconductor devices.

According to the present invention, it is possible to form a contact hole relatively easily without using a conventional SAC process.

Therefore, it is possible to simplify manufacturing processes for a semiconductor device and to decrease manufacturing costs.

What is claimed is:

1. A method for manufacturing a semiconductor device comprising:
   forming a plurality of conductors spaced apart from one another on a semiconductor substrate;
   providing the semiconductor substrate in a chamber of an LPCVD apparatus;
   introducing a tetramethylcyclotetrasiloxane gas and an oxygen gas to said chamber while irradiating vacuum ultraviolet light to the semiconductor substrate so as to form an insulating layer covering the conductors and the semiconductor substrate; and
   etching the insulating layer in a substantial uniform way to form a contact hole through the insulating layer, said etching being performed without a mask.

2. A method for manufacturing a semiconductor device according to claim 1, wherein the conductors are gates of transistors.

3. A method for manufacturing a semiconductor device according to claim 1, wherein the conductors are composed of tungsten.

4. A method for manufacturing a semiconductor device according to claim 1, wherein the chamber is kept at a room temperature.

5. A method for manufacturing a semiconductor device according to claim 1, wherein flow rates of the tetramethylcyclotetrasiloxane gas and the oxygen gas are substantially the same.

6. A method for manufacturing a semiconductor device according to claim 1, wherein the insulating layer has a first thickness on the conductors and has a second thickness that is smaller than the first thickness on the semiconductor substrate.

7. A method for manufacturing a semiconductor device according to claim 1, wherein a pressure in the chamber is about 300 mTorr.

8. A method for manufacturing a semiconductor device comprising:
   providing a semiconductor substrate;
   forming a plurality of conductors spaced apart from one another on the substrate;
   forming an insulating layer on the conductors and the substrate by a chemical vapor deposition using tetramethylcyclotetrasiloxane as a source gas and oxygen as an adjunction gas while the substrate is irradiated by vacuum ultraviolet light; and
   removing a part of the insulating layer in a substantial uniform way to form a contact hole through the insulating layer,
   the chemical vapor deposition being performed at a room temperature.

9. A method for manufacturing a semiconductor device according to claim 8, wherein said removing a part of the insulating layer comprises a dry etching.

10. A method for manufacturing a semiconductor device according to claim 8, wherein the conductors are gates of transistors.

11. A method for manufacturing a semiconductor device according to claim 8, wherein the conductors are composed of tungsten.

12. A method for manufacturing a semiconductor device according to claim 8, wherein flow rates of the source gas and the adjunction gas are substantially the same.

13. A method for manufacturing a semiconductor device according to claim 8, wherein the insulating layer has a first thickness on the conductors and has a second thickness that is smaller than the first thickness on the substrate.

14. A method for manufacturing a semiconductor device according to claim 8, wherein the chemical vapor deposition is performed under a pressure of about 300 mTorr.

15. A method of manufacturing a semiconductor device comprising:

providing a substrate;

forming a plurality of conductors each of which is located spaced apart from one another by a predetermined distance on the substrate;

forming an insulating layer on the conductors and the substrate using tetramethylcyclotetrasiloxane as a source gas and oxygen as an adjunct gas while the substrate is irradiated by vacuum ultraviolet light so that the insulating layer has a first thickness on the conductors and has a second thickness that is smaller than the first thickness on the substrate; and removing the insulating layer having the second thickness to form a contact hole therethrough.

16. A method of manufacturing a semiconductor device according to claim 15, wherein said removing the insulating layer comprises a dry etching.

17. A method of manufacturing a semiconductor device according to claim 15, wherein the conductors are composed of tungsten.

18. A method of manufacturing a semiconductor device according to claim 15, wherein the insulating layer is formed at a room temperature.

19. A method for manufacturing a semiconductor device according claim 15, wherein flow rates of the source gas and the adjunct gas are substantially the same.

* * * * *